(12) United States Patent
Strang et al.

(10) Patent No.: US 6,674,241 B2
(45) Date of Patent: Jan. 6, 2004

(54) PLASMA PROCESSING APPARATUS AND METHOD OF CONTROLLING CHEMISTRY

(75) Inventors: Eric J. Strang, Chandler, AZ (US); Paul Moroz, Marblehead, MA (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 10/199,120

(22) Filed: Jul. 22, 2002

(65) Prior Publication Data

US 2003/0020411 A1 Jan. 30, 2003

Related U.S. Application Data

(60) Provisional application No. 60/307,173, filed on Jul. 24, 2001.

(51) Int. Cl.[7] .............................................. H05B 31/26
(52) U.S. Cl. ............................. 315/111.41; 315/111.71
(58) Field of Search ....................... 315/111.71, 111.41; 118/723, 723 R, 723 I, 723 IR; 156/345, 243, 643

(56) References Cited

U.S. PATENT DOCUMENTS

| | | | | |
|---|---|---|---|---|
| 5,897,713 A | * | 4/1999 | Tomioka et al. | 118/723 I |
| 6,143,084 A | * | 11/2000 | Li et al. | 118/723 IR |
| 6,432,260 B1 | * | 8/2002 | Mahoney et al. | 156/345.35 |

* cited by examiner

*Primary Examiner*—Don Wong
*Assistant Examiner*—Chuc Tran
(74) *Attorney, Agent, or Firm*—Oblon, Spivak, McClelland, Maier & Neustadt, P.C.

(57) ABSTRACT

A plasma processing apparatus including a processing chamber having an upper surface, a first inlet, and a second inlet. The apparatus includes a wall extending from the upper surface into the processing chamber. The wall encircles the first inlet, and the wall has a base end and a terminal end, where the terminal end includes the second inlet. The apparatus includes a first inductive coil provided within the wall and encircling the first inlet, and a second inductive coil provided within the wall and encircling the second inlet. Additionally, the apparatus includes a first magnet array provided within the base end of the wall adjacent the first inlet, and a second magnet array provided within the terminal end of the wall adjacent the second inlet. A method of controlling plasma chemistry within a plasma processing apparatus is provided that includes the steps of providing a first magnetic field about a first injection region and providing a second magnetic field about a second injection region. The method further includes introducing a first process gas into the first injection region via a first inlet, and introducing a second process gas into the second injection region via a second inlet. The chamber has a wall encircling the first inlet, such that the wall has a terminal end including the second inlet.

44 Claims, 4 Drawing Sheets

US 6,674,241 B2

PLASMA PROCESSING APPARATUS AND METHOD OF CONTROLLING CHEMISTRY

CROSS-REFERENCE TO RELATED APPLICATIONS

This application claims priority to U.S. provisional application Ser. No. 60/307,173, filed Jul. 24, 2001, the entire contents of which are herein incorporated by reference.

BACKGROUND OF THE INVENTION

1. Field of the Invention

The present invention relates to plasma processing systems.

2. Discussion of the Background

Oxide etch processes, such as high aspect ratio contact etching and self-align contact etching, have requirements for etch rate, side-wall profile, selectivity, etc., in order to ensure viability of the finished product. In order to achieve state-of-the-art oxide etch performance and meet the requirements for most oxide etch processes, conventional wisdom suggests that the plasma chemistry should be optimized to form specific etch reactants. For instance, most people in the semiconductor community believe in utilizing a proper balance between polymers such as carbon containing species (e.g. CF, $CF_2$ and $CF_3$) and other reactive species such as fluorine radical. In many cases, it is desirable to produce a carbon polymer with low fluorine content in order to form protective films over non-oxide surfaces (such as SiN or poly-Si), while still permitting oxide etch. However, a large amount of $C_xF_y$ radical species can lead to a stop in etching due to the accumulation of polymers. Additionally, an excessive amount of fluorine radicals can lead to poor etch selectivity of oxide-to-silicon or SiN, since the fluorine radicals will readily etch both materials. Therefore, several etch parameters including etch selectivity (i.e. oxide-to-silicon), etch rate, side-wall profile, etc. are sensitively determined based upon the dissociation condition.

In general, capacitively coupled plasma (CCP) reactors have featured medium to high density plasmas and relatively small reaction volumes, and therefore CCP reactors have not been preempted to seek new means for dissociation control. However, with an increasing need to move towards higher plasma densities, control of the dissociation condition poses a greater demand for attention. To the contrary, inductively coupled plasma (ICP) sources, as well as others (e.g. electron cyclotron resonance (ECR)), have featured high density plasmas and relatively large reaction volumes. Such systems require immediate attention to control dissociation.

One approach used to control the dissociation condition is to present the reaction volume with a scavenging source to introduce material capable of "scavenging" or bonding with free fluorine radicals present in the reaction volume. For example, in an oxide etch, the scavenging source might be a silicon reactor liner, silicon upper electrode, etc., or it might be a silicon containing gas such as silane. Other surfaces in the reactor may be fabricated from quartz, and these surfaces may be used to getter carbon polymer. The efficacy of these surfaces to act as scavengers is heavily dependent on the temperature of the surface. Hence, with the correct balance of carbon polymer removal or lack of removal, and the introduction of silicon to scavenge fluorine, the etch process may be fine tuned for optimal process performance (or optimal plasma chemistry). However, the use of scavenging and gettering surfaces leads to a significantly greater cost for consumable materials as well as additional down time for consumable replacement.

SUMMARY OF THE INVENTION

In an effort to eliminate the deficiencies of currently available systems, the present invention provides a plasma processing apparatus and method of controlling the etch chemistry within a plasma processing apparatus that achieves state-of-the-art oxide etch performance and meets the requirements for oxide etch processes without the need for using consumable materials.

The present invention advantageously provides a plasma processing apparatus including a processing chamber having an upper surface, a first gas inlet, and a second gas inlet. The plasma processing apparatus further includes a first wall extending from the upper surface into the processing chamber. The first wall encircles the first gas inlet, and the first wall has a base end and a terminal end, where the terminal end includes the second gas inlet. The plasma processing apparatus includes a first inductive coil provided within the first wall and encircling the first gas inlet, and a second inductive coil provided within the first wall and encircling the second gas inlet. Additionally, the plasma processing apparatus includes a first magnet array provided within the base end of the first wall adjacent the first gas inlet, and a second magnet array provided within the terminal end of the first wall adjacent the second gas inlet.

The present invention advantageously provides a plasma processing apparatus including a processing chamber having an upper surface, a first gas inlet, and a second gas inlet. The plasma processing apparatus includes a wall extending from the upper surface into the processing chamber. The wall encircles the first gas inlet, and the wall has a terminal end including the second gas inlet. The plasma processing apparatus includes a first injection region provided adjacent the first gas inlet, and a second injection region provided adjacent the second gas inlet. Additionally, the plasma processing apparatus includes means for providing a first magnetic field provided about the first injection region, and means for providing a second magnetic field provided about the second injection region.

The present invention advantageously provides a method of controlling plasma chemistry within a plasma processing apparatus. The method includes the steps of providing a first magnetic field about a first injection region in a processing chamber and providing a second magnetic field about a second injection region in the processing chamber. The method further includes the steps of introducing a first process gas into the first injection region via a first gas inlet, and introducing a second process gas into the second injection region via a second gas inlet. The processing chamber has a wall encircling the first gas inlet, such that the wall has a terminal end including the second gas inlet.

BRIEF DESCRIPTION OF THE DRAWINGS

A more complete appreciation of the invention and many of the attendant advantages thereof will become readily apparent with reference to the following detailed description, particularly when considered in conjunction with the accompanying drawings, in which.

DETAILED DESCRIPTION OF THE INVENTION

Figure 1:
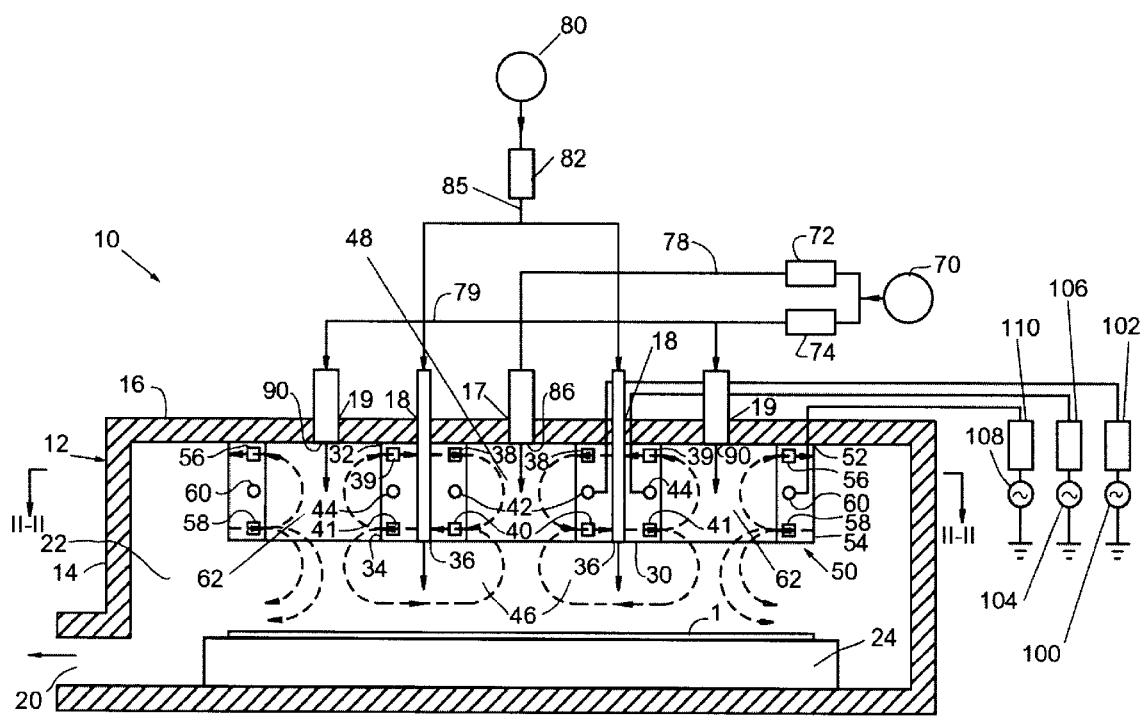
FIG. 1 is a partial cross-sectional view of an embodiment of the plasma processing apparatus according to the present invention.
Figure 2:
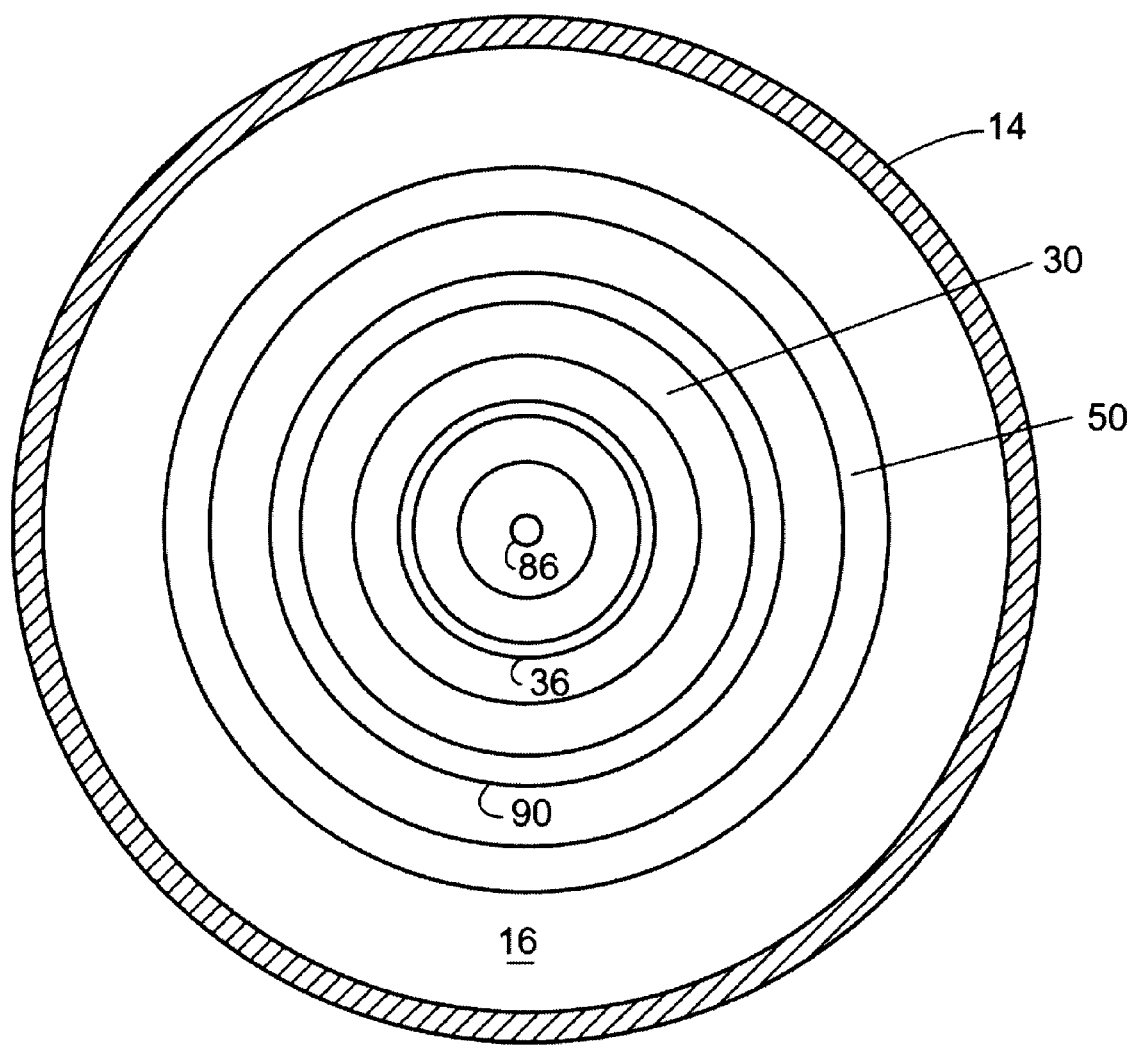
FIG. 2 is a cross-sectional view of the plasma processing apparatus taken along line II—II in FIG. 1.
Figure 3:
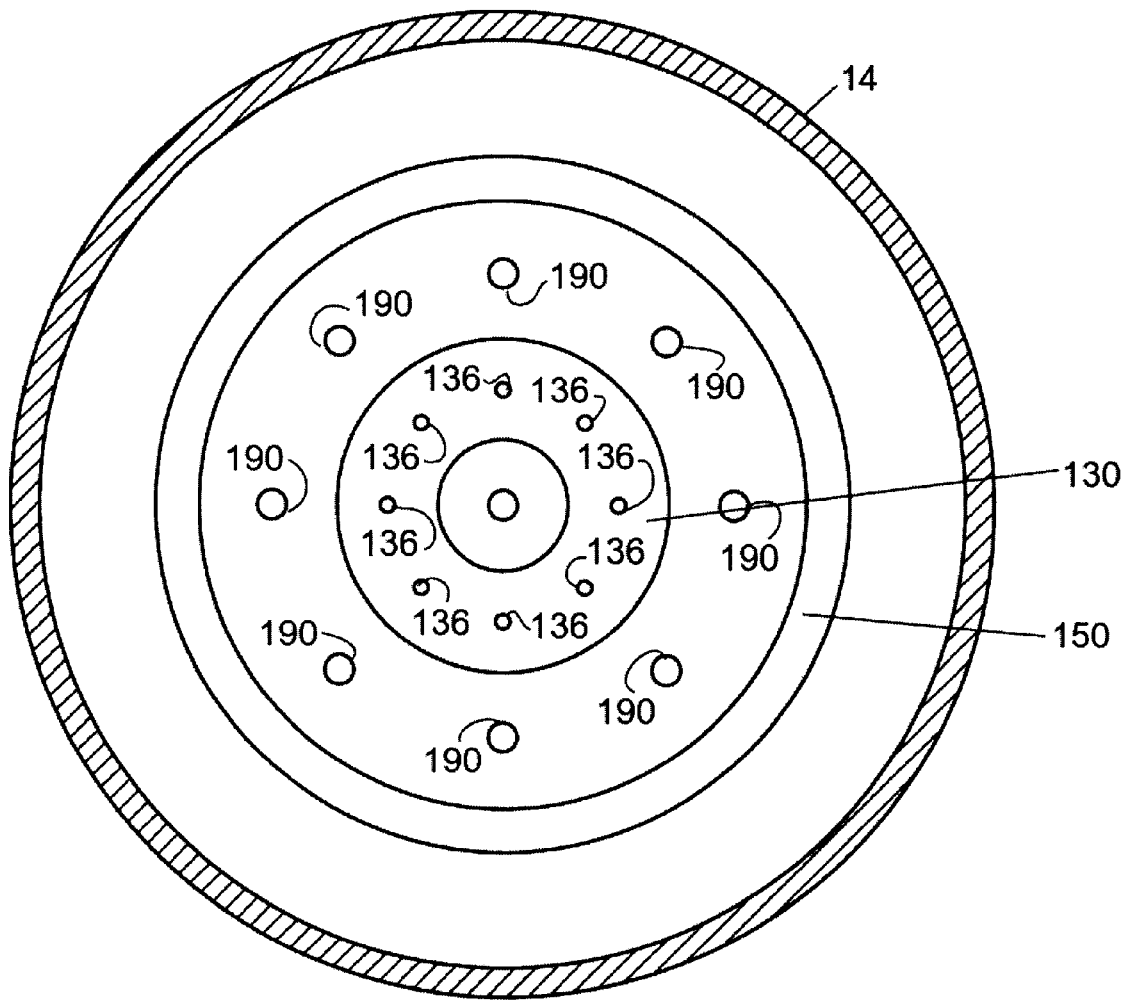
FIG. 3 is a cross-sectional view of an alternative embodiment of the plasma processing apparatus according to the present invention.

FIGS. 1 and 2 depict a preferred embodiment of the present invention. FIG. 1 is a partial cross-sectional view of the preferred embodiment depicting the internal features of the plasma processing apparatus according to the present invention, and FIG. 2 depicts a cross-sectional view taken along line II—II of FIG. 1. FIG. 3 depicts an alternative embodiment of the plasma processing apparatus according to the present invention.

As depicted in FIG. 1, the present invention advantageously provides a plasma processing apparatus 10 including a processing chamber 12 having walls 14 that define a plasma etching environment 22. The processing chamber 12 has an upper surface 16 with a plurality of holes, namely hole 17, annular hole 18, and annular hole 19, which are configured to provide passage of inlets to the processing chamber 12. The processing chamber 12 has a passage 20 that is connected to a vacuum pump (not depicted). The processing chamber 12 further includes a chuck assembly 24 that is configured to hold a semiconductor wafer or substrate 1 during processing thereof. The wafer 1 is set atop and affixed to the upper surface of the chuck assembly 24, both of which reside within the processing chamber 12 adjacent a plasma generating source. A vacuum pump (not depicted) is utilized to evacuate the plasma etching environment 22 via passage 20 thereby providing a clean (and to the extent possible, a contamination-free chamber environment) low pressure environment for materials processing.

The plasma processing apparatus 10 includes a first gas inlet 86 that extends within hole 17 of the upper surface 16 of the processing chamber 12. The plasma processing apparatus 10 further includes a second gas inlet 36 that extends within annular hole 18 of the upper surface 16. The plasma processing apparatus further preferably includes a third gas inlet 90 that extends within annular hole 19 of the upper surface 16. In the preferred embodiment, the second gas inlet 36 and the third gas inlet 90 are generally annular in shape. Alternative embodiments of the gas inlets will be discussed below with respect to FIG. 3.

The plasma processing apparatus 10 includes a first wall 30 extending from the upper surface 16 into the processing chamber 12 at a position above the chuck assembly 24. The first wall 30 of the preferred embodiment is generally annular in shape and has a rectangular vertical cross section. The first wall 30 has a base end 32 and a terminal end 34, and encircles the first gas inlet 86. The terminal end 34 of the first wall 30 includes the second gas inlet 36. The processing chamber 12 preferably includes a second wall 50 extending from the upper surface 16 into the processing chamber 12. The second wall 50 has a base end 52 and a terminal end 54, and encircles the third gas inlet 90.

The plasma processing apparatus 10 includes an upper or first magnet array including an interior magnet array 38 and an exterior magnet array 39. The first magnetic interior and exterior arrays 38, 39 are provided within the base end 32 of the first wall 30 adjacent the first gas inlet 86. The plasma processing apparatus 10 includes a lower or second magnet array including an interior magnet array 40 and an exterior magnet array 41. The second magnetic interior and exterior arrays 40, 41 are provided within the terminal end 34 of the first wall 30 adjacent the second gas inlet 36. Additionally, the plasma processing apparatus 10 preferably includes an upper or first magnet array 56 provided within the base end 52 of the second wall 50 adjacent the third gas inlet 90, and a lower or second magnet array 58 provided within the terminal end 54 of the second wall 50.

The plasma processing apparatus 10 includes a first inductive coil 42 provided within the first wall 30 and encircling the first gas inlet 86, and a second inductive coil 44 provided within the first wall 30 and encircling the second gas inlet 36. The plasma processing apparatus 10 further includes a first radio frequency generator 100 connected to the first induction coil 42 through a first match network 102, a second radio frequency generator 104 connected to the second induction coil 44 through a second match network 106. Additionally, the plasma processing apparatus 10 preferably includes a third inductive coil 60 provided within the second wall 50 and encircling the third gas inlet 90. Accordingly, the plasma processing apparatus 10 preferably includes a third radio frequency generator 108 connected to the third induction coil 60 through a third match network 110.

The plasma processing apparatus 10 further includes a first process gas supply 70 connected to the first gas inlet 86 via conduit 78 and preferably connected to the third gas inlet 90 via conduit 79. The plasma processing apparatus 10 further preferably includes a second process gas supply 80 connected to the second gas inlet 36 via conduit 85. In the preferred embodiment, the amount of gas supplied by the first process gas supply 70 to the first inlet 86 is controlled by a mass flow controller 72, the amount of gas supplied by the first process gas supply 70 to the third inlet 90 is controlled by a mass flow controller 74, and the amount of gas supplied by the second process gas supply 80 to the second inlet 36 is controlled by a mass flow controller 82.

In the present invention, plasma is generated in injection regions 46, 48, and 62 by the induction coils 42, 44, and 60. In particular, induction coil 42 encircles a cylindrical injection region 48 defined by an interior of the first wall 30. The induction coils 48 and 62 couple power to an annular injection region 62, which is defined as the region between an interior of the second wall 50 and an exterior of the wall 30. Each induction coil is preferably a single-turn loop antenna, wherein the coil is encased within a conducting wall enclosure except for a dielectric (e.g. quartz) window adjacent to the respective injection region through which an RF field is coupled. In an alternate embodiment, a Faraday shield (i.e. a grounded electrostatic shield comprising slots) is inserted between the dielectric window and the induction coils 42, 44 and 60 to minimize capacitive coupling between an induction coil and the plasma. The use of a Faraday shield in an inductively coupled plasma source is well known to those skilled in the art. RF power is coupled to the plasma from a series of RF generators 100, 104, and 108, through match networks, 102, 106, and 110, respectively, with a topology such as a T-network topology. Plasma density in annular injection region 62 and cylindrical injection region 48 can be independently controlled by antenna power and gas flow rate to the respective region.

In an alternate embodiment, only the first induction coil 42 and third induction coil 60 with respective RF generators 100, 108 and match networks 102, 110 are employed for forming plasma in regions 48 and 62.

The permanent magnets within first and second magnet arrays, 38, 39, 40, 41, 56, 58, are installed adjacent the cylindrical injection region 48 and the annular injection region 62 in order to create DC magnetic fields (represented by dashed lines depicted in FIG. 1 with directions indicated by arrow). Firstly, the magnetic field configuration in injection regions 48 and 62 permits generation of high density plasmas with protection of the dielectric window (due to a substantially parallel magnetic field relative to the cylindrical process tube surface). A primary process gas (such as argon) is injected into injection regions 48 and 62 through mass flow controllers 72 and 74, respectively. Alternatively, the mass flow controllers 72 and 74 can be independently connected to separate gas supplies of separate gases.

A secondary gas injection region 46 is sandwiched between cylindrical region 48 and annular region 62. The secondary gas injection region 46 is used for introducing a secondary process gas that is preferably of a substantially different composition than that of the primary gas. For example, in an oxide etch, the secondary process gas can include a greater concentration (or flow rate) of $C_xF_y$ gas. The $C_xF_y$ gas can, for example, be $C_4F_6$, $CF_4$, $C_4F_8$, $C_5F_8$, $C_2F_6$, etc. The secondary process gas, such as $C_xF_y$, can be diluted with argon, and can include additional species such as $O_2$ or CO. Alternatively, the secondary process gas can be of an identical or similar composition and/or concentration to that of the first process gas.

The magnetic field present in injection region 46, which is generated by second magnet arrays 40 and 41, is substantially parallel to a lower surface of the terminal end 34 of the first wall 30. Accordingly, the substantially parallel magnetic field in injection region 46 protects process gas from energetic electrons capable of dissociation (electron diffusion across magnetic field is inhibited by a sufficiently strong magnetic field, e.g. approximately 200 Gauss). This magnet arrangement facilitates a reduction of $C_xF_y$ dissociation in a high density plasma leading to improved $SiO_2$ to Si (or SiN) etch selectivity, while not sacrificing etch rates achieved in current inductively coupled plasma (ICP) reactors.

In injection regions 48 and 62, the first magnetic array 38, 39, 56 is preferably of stronger strength (i.e. provides a stronger magnetic field) than the second magnetic array 40, 41, 58 in order to facilitate a downward diverging magnetic field as depicted in FIG. 1. Such a downward diverging magnetic field enhances plasma transport from injection regions 48 and 62 towards the substrate 1 and thus forms a processing plasma in contact with the substrate 1.

In an alternate embodiment, the plasma processing device 10 excludes the use of permanent magnets.

In an alternate embodiment, the plasma processing device 10 employs permanent magnets in arrays 38, 39, 56, 40, 41 and 58; however, the polarity of the permanent magnets are reconfigured to create a magnetic field other than the mirror field as described with reference to FIG. 1. For example, the polarity of the permanent magnets in arrays 40, 41 and 58 are reversed in direction to create a cusp field. The cusp field can serve a similar purpose as the mirror field; however, it can lead to higher plasma densities at the expense of protection to the quartz process walls in plasma regions 48 and 62.

Furthermore, dissociation control can be achieved by controlling a ratio of process gas ($C_xF_y$) introduced through injection regions 48 and 62 (via the first gas inlet 86 and the third gas inlet 90) versus through injection region 46 (via the second gas inlet 36). Such a dissociation control can be achieved through the use of the mass flow controllers 72, 74, 82.

In the embodiment depicted in FIG. 2, the second gas inlet 36 is annular in shape, and is positioned such that a center of the annular second gas inlet 36 is aligned with a center of the first gas inlet 86. Additionally, in the embodiment of FIG. 2, the third gas inlet 90 is annular in shape and is concentric with the second gas inlet 36. FIG. 3 depicts a preferred embodiment of the present invention. In the preferred embodiment, the second gas inlet 36 is a series of inlet holes 136 provided in an annular configuration on a terminal end of the first wall 130. Additionally, the third gas inlet 90 is a series of inlet holes 190 provided in an annular configuration on a terminal end of the second wall 150. The inlet holes 136 of the second gas inlet can be aligned with the inlet holes 190 of the third gas inlet along radial lines extending from the center of the first gas inlet 86, as depicted in FIG. 3. Alternatively, the inlet holes 136 of the second gas inlet do not have to be aligned with the inlet holes 190 of the third gas inlet along the radial lines, but rather offset by a given amount. Preferably, the inlet holes for the second and third gas inlets are evenly distributed. Alternately, the first inlet 86 comprises a plurality of inlet holes.

In an alternate embodiment, plasma regions 48 and 62 are vertically displaced relative to one another and to the substrate 1 in order to optimize the processing plasma for uniform processing. For example, base end 52 and terminal end 54 of wall 50 are below base end 32 and terminal end 34 of wall 30, respectively, such that plasma region 62 is closer to substrate 1 than plasma region 48.

Figure 4:
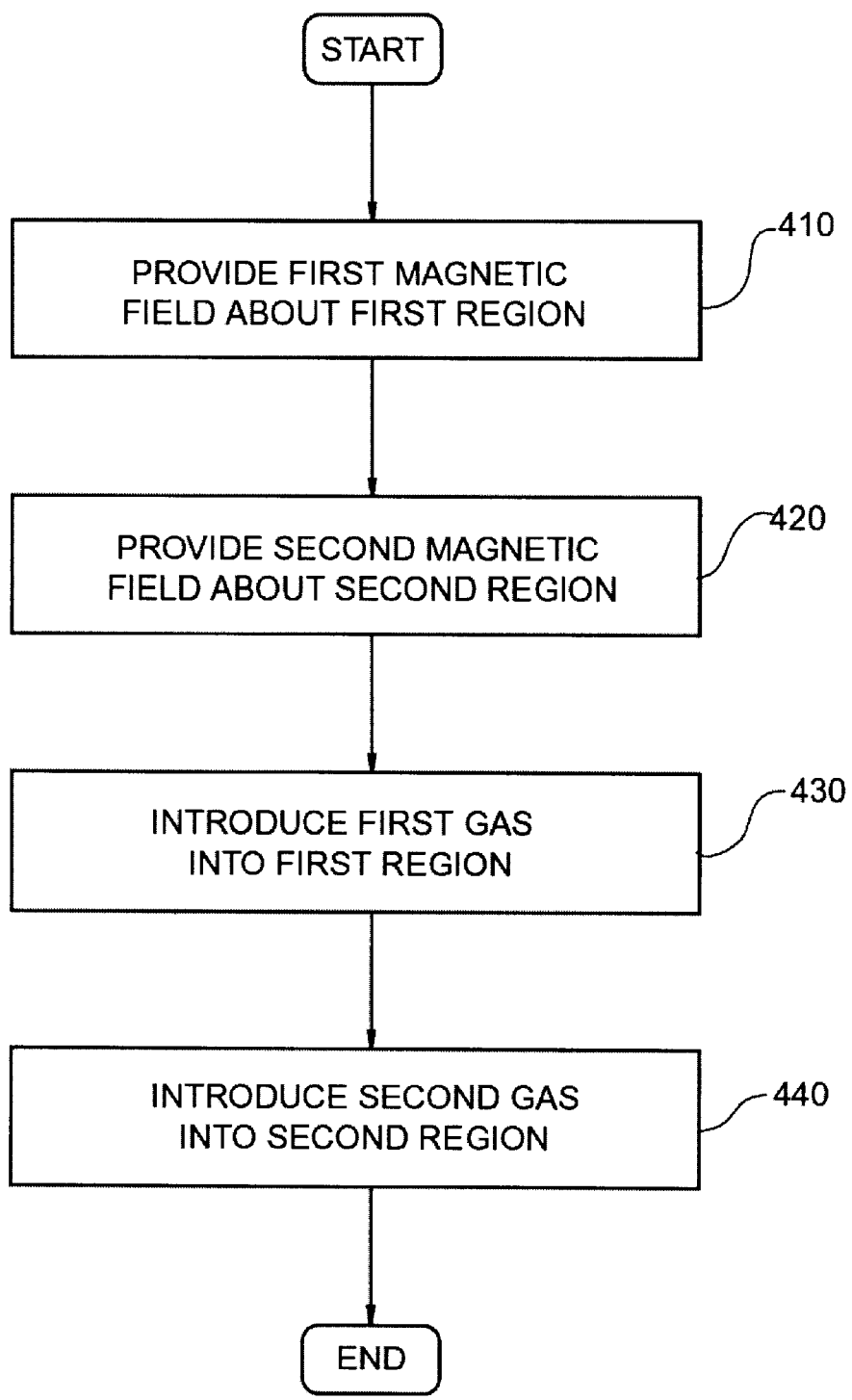
FIG. 4 is a flow diagram of a method of controlling plasma chemistry within a plasma processing apparatus.

The present invention further advantageously provides a method of controlling plasma chemistry within a plasma processing apparatus. The method is set forth in a flow diagram in FIG. 4. The method includes a step 410 of providing a first magnetic field about a first injection region in a processing chamber. In the embodiment depicted in FIG. 1, the first magnetic field about the cylindrical injection region 48 is generally provided by first and second magnetic arrays 38, 39, 40, 41. The cylindrical injection region 48 is adjacent the first interior magnetic array 38 and the second interior magnetic array 40. The method includes a step 420 of providing a second magnetic field about a second injection region in the processing chamber. In the embodiment depicted in FIG. 1, the second magnetic field about the injection region 46 is generally provided by first and second magnetic arrays 38, 39, 40, 41. The injection region 46 is adjacent the second interior magnetic array 40 and the second exterior magnetic array 41.

The method further includes the step 430 of introducing a first process gas into the first injection region via a first gas inlet. In the embodiment depicted in FIG. 1, the first process gas is introduced into the cylindrical injection region 48 via gas inlet 86. The method includes a step 440 of introducing a second process gas into the second injection region via a second gas inlet, where the processing chamber has a wall encircling the first gas inlet, such that the wall has a terminal end including the second gas inlet. In the embodiment depicted in FIG. 1, the second process gas is introduced into the injection region 46 via gas inlet 36. The processing chamber 12 has a wall 30 encircling the gas inlet 86 such that the wall 30 has a terminal end 34 including the gas inlet 36.

The preferred method includes an additional step of and providing a third magnetic field about a third injection region 62 in the processing chamber 12. Additionally, a third process gas is introduced into the third injection region 62 via a third gas inlet 90. The processing chamber 12 has a second wall 50 encircling the third gas inlet 90.

It should be noted that the exemplary embodiments depicted and described herein set forth the preferred embodiments of the present invention, and are not meant to limit the scope of the claims hereto in any way.

Numerous modifications and variations of the present invention are possible in light of the above teachings. It is therefore to be understood that, within the scope of the appended claims, the invention may be practiced otherwise than as specifically described herein.

What is claimed as new and desired to be secured by Letters Patent of the United States is:

1. A plasma processing apparatus including:
    a processing chamber having an upper surface, a first gas inlet, and a second gas inlet;
    a first wall extending from the upper surface into the processing chamber, the first wall encircling the first gas inlet, the first wall having a base end and a terminal end, the terminal end including the second gas inlet;
    a first inductive coil provided within the first wall and encircling the first gas inlet;
    a second inductive coil provided within the first wall and encircling the second gas inlet;
    a first magnet array provided within the base end of the first wall adjacent the first gas inlet; and
    a second magnet array provided within the terminal end of the first wall adjacent the second gas inlet.

2. The plasma processing apparatus according to claim 1, further including:
    a third gas inlet to the processing chamber;
    a second wall extending from the upper surface into the processing chamber, the second wall encircling the third gas inlet, the second wall having a base end and a terminal end; and
    a third inductive coil provided within the second wall and encircling the third gas inlet,
    wherein the first magnet array is provided within the base end of the second wall adjacent the third gas inlet, and wherein the second magnet array is provided within the terminal end of the second wall.

3. The plasma processing apparatus according to claim 2, further including a first process gas supply connected to the first gas inlet and the third gas inlet, and a second process gas supply connected to the second gas inlet.

4. The plasma processing apparatus according to claim 3, wherein the first process gas supply supplies a gas having a different composition than a gas supplied by the second process gas supply.

5. The plasma processing apparatus according to claim 2, further including a first process gas supply connected to the first gas inlet, a second process gas supply connected to the second gas inlet, and a third process gas supply connected to the third gas inlet.

6. The plasma processing apparatus according to claim 1, further including a mass flow controller configured to control gas flow to the first gas inlet.

7. The plasma processing apparatus according to claim 1, further including a mass flow controller configured to control gas flow to the second gas inlet.

8. The plasma processing apparatus according to claim 2, further including a mass flow controller configured to control gas flow to the third gas inlet.

9. The plasma processing apparatus according to claim 1, wherein the second gas inlet includes an annular array of inlet holes.

10. The plasma processing apparatus according to claim 2, wherein the third gas inlet includes an annular array of inlet holes.

11. The plasma processing apparatus according to claim 1, further including a first radio frequency generator connected to the first induction coil through a first match network, and a second radio frequency generator connected to the second induction coil through a second match network.

12. The plasma processing apparatus according to claim 1, wherein the first magnetic array provides a stronger magnetic field than the second magnetic array.

13. The plasma processing apparatus according to claim 1, wherein the second magnet array produces a magnetic field having magnetic lines of force extending parallel to an end surface of the terminal end of the first wall.

14. A plasma processing apparatus including:
    a processing chamber having an upper surface, a first gas inlet, and a second gas inlet;
    a wall extending from the upper surface into the processing chamber, the wall encircling the first gas inlet, the wall having a terminal end including the second gas inlet;
    a first injection region provided adjacent the first gas inlet;
    a second injection region provided adjacent the second gas inlet;
    means for providing a first magnetic field provided about the first injection region; and
    means for providing a second magnetic field provided about the second injection region.

15. The plasma processing apparatus according to claim 14, wherein the first injection region is cylindrical in shape.

16. The plasma processing apparatus according to claim 14, wherein the second injection region is annular in shape.

17. The plasma processing apparatus according to claim 14, further including:
    a third gas inlet to the processing chamber;
    a second wall extending from the upper surface into the processing chamber, the second wall encircling the third gas inlet;
    a third injection region provided adjacent the third gas inlet; and
    means for providing a third magnetic field provided about the third injection region.

18. The plasma processing apparatus according to claim 17, further including a first process gas supply connected to the first gas inlet and the third gas inlet, and a second process gas supply connected to the second gas inlet.

19. The plasma processing apparatus according to claim 18, wherein the first process gas supply supplies a gas having a different composition than a gas supplied by the second process gas supply.

20. The plasma processing apparatus according to claim 17, further including a first process gas supply connected to the first gas inlet, a second process gas supply connected to the second gas inlet, and a third process gas supply connected to the third gas inlet.

21. The plasma processing apparatus according to claim 14, further including a mass flow controller configured to control gas flow to the first gas inlet.

22. The plasma processing apparatus according to claim 14, further including a mass flow controller configured to control gas flow to the second gas inlet.

23. The plasma processing apparatus according to claim 17, further including a mass flow controller configured to control gas flow to the third gas inlet.

24. The plasma processing apparatus according to claim 14, wherein the second gas inlet includes an annular array of inlet holes.

25. The plasma processing apparatus according to claim 17, wherein the third gas inlet includes an annular array of inlet holes.

26. The plasma processing apparatus according to claim 14, wherein the means for providing the first magnetic field includes a means for facilitating a magnetic field diverging in a direction away from the first gas inlet.

27. The plasma processing apparatus according to claim 17, wherein the means for providing the third magnetic field includes a means for facilitating a magnetic field diverging in a direction away from the third gas inlet.

28. The plasma processing apparatus according to claim 17, further including means for controlling dissociation by controlling a ratio of process gas introduced through the first gas inlet and the third gas inlet versus process gas introduced through the second gas inlet.

29. The plasma processing apparatus according to claim 14, wherein the first magnetic field is stronger than the second magnetic field.

30. A method of controlling plasma chemistry within a plasma processing apparatus, the method including the steps of:
providing a first magnetic field about a first injection region in a processing chamber;
providing a second magnetic field about a second injection region in a processing chamber;
introducing a first process gas into the first injection region via a first gas inlet; and
introducing a second process gas into the second injection region via a second gas inlet, the processing chamber having a wall encircling the first gas inlet, the wall having a terminal end including the second gas inlet.

31. The method according to claim 30, further including the steps of:
providing a third magnetic field about a third injection region in the processing chamber; and
introducing a third process gas into the third injection region via a third gas inlet, the processing chamber having a second wall encircling the third gas inlet.

32. The method according to claim 31, wherein the first process gas and the third process gas are introduced using a first process gas supply connected to the first gas inlet and the third gas inlet, and the second process gas is introduced using a second process gas supply connected to the second gas inlet.

33. The method according to claim 32, wherein the first process gas supply supplies a gas having a different composition than a gas supplied by the second process gas supply.

34. The method according to claim 31, wherein the first process gas is introduced using a first process gas supply connected to the first gas inlet, the second process gas is introduced using a second process gas supply connected to the second gas inlet, and the third process gas is introduced using a third process gas supply connected to the third gas inlet.

35. The method according to claim 30, further including the step of controlling gas flow to the first gas inlet.

36. The method according to claim 30, further including the step of controlling gas flow to the second gas inlet.

37. The method according to claim 31, further including the step of controlling gas flow to the third gas inlet.

38. The method according to claim 30, providing a first magnetic field that is stronger than the second magnetic field.

39. The method according to claim 30, wherein the second magnetic field is produced to have magnetic lines of force extending parallel to an end surface of the terminal end of the first wall.

40. The method according to claim 30, wherein the step of providing the first magnetic field includes a step of facilitating a magnetic field diverging in a direction away from the first gas inlet.

41. The method according to claim 30, wherein the step of providing the third magnetic field includes a step of facilitating a magnetic field diverging in a direction away from the third gas inlet.

42. The method according to claim 30, further including the step of controlling dissociation by controlling a ratio of the first process gas introduced through the first gas inlet versus the second process gas introduced through the second gas inlet.

43. The method according to claim 31, further including the step of controlling dissociation by controlling a ratio of the first process gas introduced through the first gas inlet and the third process gas introduced through the third gas inlet versus the second process gas introduced through the second gas inlet.

44. The method according to claim 30, further including the step of creating plasma in at least one of the first process region and the second process region.

* * * * *